United States Patent
Schnabel et al.

(10) Patent No.: US 7,049,930 B2
(45) Date of Patent: May 23, 2006

(54) ARRANGEMENT OF SEVERAL RESISTORS JOINTLY POSITIONED IN A WELL OF A SEMICONDUCTOR DEVICE, AND A SEMICONDUCTOR DEVICE INCLUDING AT LEAST ONE SUCH ARRANGEMENT

(75) Inventors: Joachim Schnabel, Munich (DE); Andre Schaefer, Munich (DE); Xaver Obergrussberger, Pleiskirchen (DE); Sebastian Mosler, Dresden (DE)

(73) Assignee: Infineon Technologies AG, Munich (DE)

( * ) Notice: Subject to any disclaimer, the term of this patent is extended or adjusted under 35 U.S.C. 154(b) by 71 days.

(21) Appl. No.: 10/663,354

(22) Filed: Sep. 16, 2003

(65) Prior Publication Data
US 2004/0130433 A1 Jul. 8, 2004

(30) Foreign Application Priority Data
Sep. 19, 2002 (DE) ............................. 102 43 604

(51) Int. Cl.
*H01C 1/01* (2006.01)
(52) U.S. Cl. ........................ 338/320; 338/295
(58) Field of Classification Search ............. 338/295, 338/307, 320; 257/904
See application file for complete search history.

(56) References Cited

U.S. PATENT DOCUMENTS

| 4,191,964 A | * | 3/1980 | Kant ............................ 257/536 |
| 4,466,013 A | * | 8/1984 | van de Plassche et al. . 257/536 |
| 4,636,831 A | * | 1/1987 | Ono et al. .................... 257/536 |
| 4,646,056 A | * | 2/1987 | Brokaw ...................... 338/195 |
| 5,111,068 A | * | 5/1992 | Kusakabe ................... 327/565 |
| 5,293,148 A | * | 3/1994 | Hancock ..................... 338/295 |
| 5,827,967 A | | 10/1998 | Ueyanagi et al. ......... 73/514.33 |
| 6,104,277 A | * | 8/2000 | Iniewski et al. ............. 338/311 |
| 6,263,740 B1 | * | 7/2001 | Sridhar et al. ................ 73/754 |

FOREIGN PATENT DOCUMENTS

| DE | 195 46 953 A1 | | 8/1996 | |
| JP | 2-7573 | * | 1/1990 | .................. 257/415 |
| JP | 6-5788 | * | 1/1994 | |

OTHER PUBLICATIONS

IBMTDB NN78013096 "Test Site to Dettermine Accurcay. of Automatic Probing Systems" Jan. 1978, V.20, Iss. 8, pp. 1096-1098.*

* cited by examiner

*Primary Examiner*—Tu Hoang
(74) *Attorney, Agent, or Firm*—Arendt & Associates Intellectual Property Group; Jacqueline Arendt

(57) ABSTRACT

An arrangement of several resistors jointly positioned in one and the same well of a semiconductor device, as well as to a semiconductor device including at least one such arrangement of resistors, wherein the resistors, when viewed in a longitudinal direction of the resistors, are displaced in relation to one another.

22 Claims, 2 Drawing Sheets

ARRANGEMENT OF SEVERAL RESISTORS JOINTLY POSITIONED IN A WELL OF A SEMICONDUCTOR DEVICE, AND A SEMICONDUCTOR DEVICE INCLUDING AT LEAST ONE SUCH ARRANGEMENT

FIELD OF THE INVENTION

The disclosure relates to an arrangement of several resistors jointly positioned in one and the same well of a semiconductor device, and a semiconductor device comprising at least one such arrangement of resistors.

BACKGROUND SECTION

Semiconductor devices, e.g. appropriate, integrated (analog or digital) computing circuits, semiconductor memory devices such as functional memory devices (PLAs, PALs, etc.) and table memory devices, e.g. ROMs or RAMS, in particular SRAMs and DRAMs) comprise a plurality of output pads for outputting data generated in the respective semiconductor device.

The output pads are connected with a device driving the corresponding output signals, i.e. a driver device.

Each driver device may, for instance, comprise a pull-up and a pull-down circuit which are connected in series, wherein the pull-up circuit may e.g. be connected to the supply voltage, and the pull-down circuit may e.g. be connected to the ground, and wherein—for the driving of a "logically high" output signal—the pull-up circuit may be switched on and the pull-down circuit may be switched off, and—for the driving of a "logically low" output signal—the pull-up circuit may be switched off and the pull-down circuit may be switched on.

For linearization of the driver behavior, a correspondingly large resistor, in particular an n-diffusion resistor, may be connected between a corresponding driver device and the respective output pad.

For generating an n-diffusion resistor, the corresponding region on the semiconductor device or the chip, respectively, is—relatively strongly—n-doped.

The resistance value of the respective n-diffusion resistor may, for instance, by set to the respectively desired amount by correspondingly selecting the length (or the breadth or the width, respectively) of the n-diffusion resistor—the longer (or broader) the n-diffusion resistor is, the higher (or lower) is the resulting resistance value.

For technological reasons, the—relatively strongly n-doped—diffusion regions of the n-diffusion resistors are embedded in a weaker n-doped region, i.e. a so-called wn-well.

In order to save chip space, several (in particular all) n-diffusion resistors are, as a rule, arranged—side by side—in one single wn-well.

Consequently, the n-diffusion resistors are—via the parasitic resistor formed by the wn-well—connected with one another, so that adjacent n-diffusion resistors mutually influence each other in their respective—effectively—resulting resistance value.

This influence is the higher, the greater the difference between the resistance values of respectively adjacent n-diffusion resistors is.

For this reason, the distance between respectively adjacent n-diffusion resistors must be chosen relatively large in prior art (in particular in the case of a relatively great difference between the resistance values).

This—relatively large—distance between the n-diffusion resistors leads to a relatively large chip space needed altogether for the arrangement of the n-diffusion resistors.

SUMMARY OF THE INVENTION

An arrangement of several resistors jointly positioned in one and the same well of a semiconductor device, and a semiconductor device comprising at least one such arrangement of resistors.

An arrangement of several resistors jointly positioned in one and the same well, in particular a wn-well, of a semiconductor device is provided, wherein the resistors—viewed in the longitudinal direction of the resistors—are displaced in relation to each other.

In a preferred development of the invention, the resistors—viewed in the longitudinal direction of the resistors—are alternately displaced to the front and to the rear (wherein, advantageously, each of the resistors displaced to the front is displaced by the same length to the front, and each of the resistors displaced to the rear is displaced by the same length to the rear).

It is of particular advantage when a particular resistor is displaced—vis-à-vis its directly adjacent resistor—by approximately the length l (or somewhat less than the length l) of the directly adjacent resistor—viewed in longitudinal direction of the resistors.

Preferably, all resistors have a substantially identical structure and feature substantially the same individual resistance value.

This—and the relatively large distances between two adjacent resistors positioned in the same plane, said distances resulting from the above-described displaced arrangement of the resistors,—has as a consequence that the resistors—which are connected with one another via the parasitic resistor formed by the wn-well—influence each other only relatively weakly in their respective—effectively—resulting resistance value.

The distance between directly succeeding or adjacent resistors—positioned in displaced planes—can therefore be chosen relatively small.

This leads altogether to a relatively small chip space needed for the resistor arrangement.

BRIEF DESCRIPTION OF THE DRAWINGS

In the following, the invention will be explained in detail by means of embodiments and the enclosed drawing. The drawing shows.

DETAILED DESCRIPTION

Figure 1:
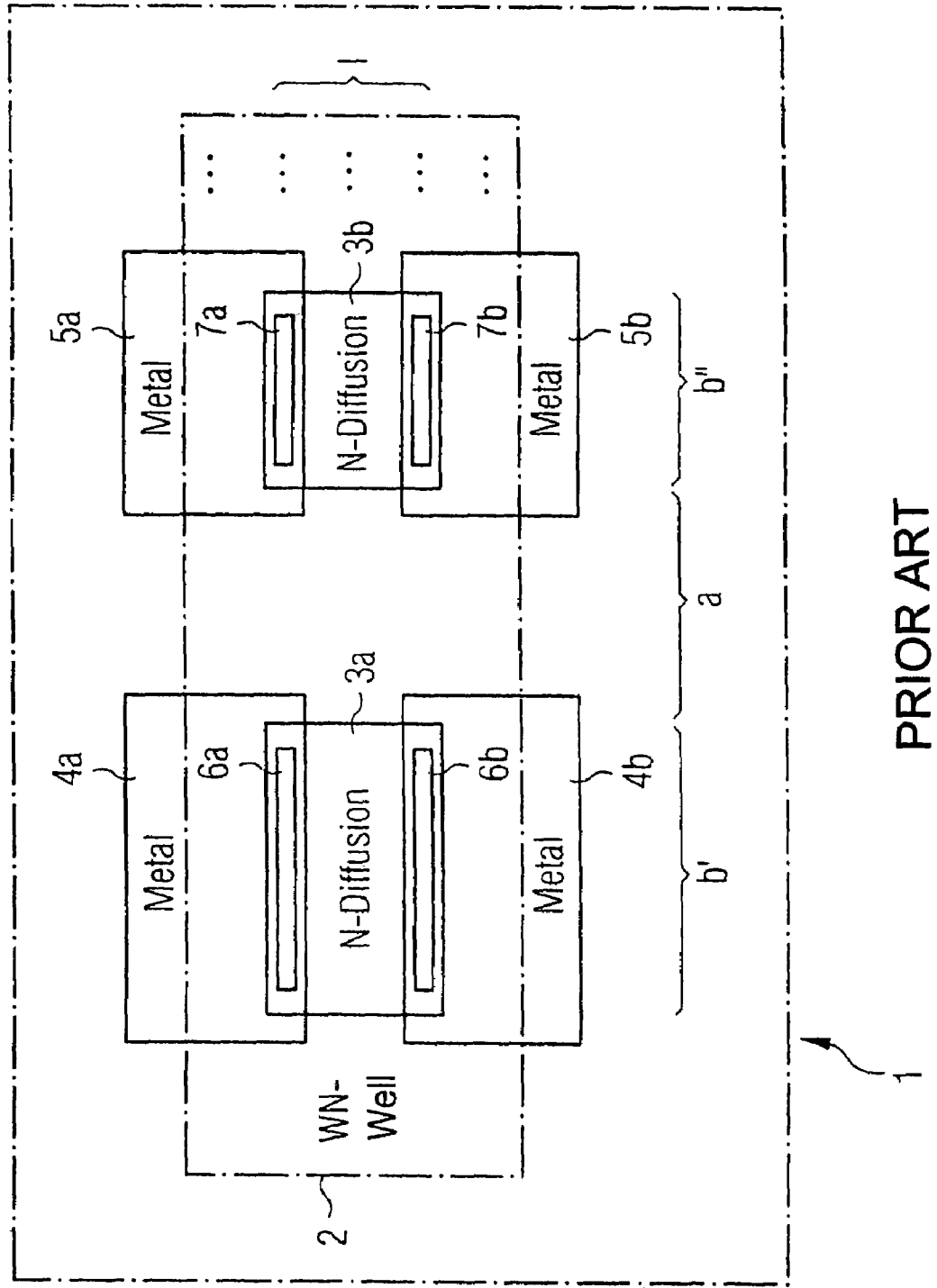
FIG. 1 a sectional view of a portion of a semiconductor device with an arrangement of adjacent n-diffusion resistors positioned in a wn-well, and of metal pads contacting same, in accordance with prior art.

FIG. 1 illustrates a sectional view of a portion 1 of a semiconductor device with an arrangement of adjacent n-diffusion resistors 3*a*, 3*b* positioned in a wn-well 2, and of metal pads 4*a*, 4*b*, 5*a*, 5*b* contacting same, in accordance with prior art.

The semiconductor device may, e.g. be an integrated (analog or digital) computing circuit, or a semiconductor memory device such as functional memory device (PLA, PAL, etc.), or a table memory device (e.g. ROM or RAM), in particular a DRAM, e.g. a DDR DRAM (Double Data Rate DRAM).

The metal pads 4a, 5a positioned "at the front" on the semiconductor device illustrated in FIG. 1 may e.g. be connected to corresponding (not illustrated) output pads of the semiconductor device, and the metal pads 4b, 5b positioned "at the rear" may e.g. be connected to corresponding (not illustrated, either) signal driver devices.

As is further illustrated in FIG. 1, the front metal pads 4a, 5a contact the respective n-diffusion resistor 3a, 3b—via a corresponding diffusion metal contact 6a, 7a— at a region positioned at the front end of the n-diffusion resistor 3a, 3b, and the rear metal pads 4b, 5b contact the respective n-diffusion resistor 3a, 3b—via a corresponding diffusion metal contact 6b, 7b—at a region positioned at the rear end of the n-diffusion resistor 3a, 3b.

By the fact that the resistance value of the respective n-diffusion resistor 3a, 3b connected between the corresponding signal driver device and the corresponding output pad is chosen correspondingly high, a linearization of the driver behavior may be achieved with the semiconductor device.

For generating the n-diffusion resistors 3a, 3b, the corresponding region on the semiconductor device or the chip, respectively, is—relatively strongly—n-doped.

The resistance value of the n-diffusion resistors 3a, 3b may, for instance, be set to the respectively desired amount by selecting (e.g. with respectively identical length l of the n-diffusion resistors 3a, 3b) their width or breadth b correspondingly—differently—large (in the development shown in FIG. 1, for instance, the (first) n-diffusion resistor 3a is designed with a—relatively large—breadth b', and the (second) n-diffusion resistor 3a with a—relatively small— breadth b", so that a relatively low resistance value results for the first n-diffusion resistor 3a, and a relatively high resistance value results for the second n-diffusion resistor 3b).

For technological reasons, the—relatively strongly n-doped—diffusion regions of the n-diffusion resistors 3a, 3b are embedded in a—relatively weakly n-doped—region (namely the above-mentioned wn-well 2).

In order to save chip space, several (in particular all) n-diffusion resistors 3a, 3b are arranged—side by side—in one single wn-well 2 (i.e. in addition to the first and second n-diffusion resistors 3a, 3b illustrated in FIG. 1, several further, not illustrated n-diffusion resistors).

Consequently, the n-diffusion resistors 3a, 3b (and the further, not illustrated n-diffusion resistors) are—via the parasitic resistor formed by the wn-well 2—connected with one another, so that adjacent n-diffusion resistors 3a, 3b mutually influence each other in their respective—effectively—resulting resistance value.

This influence is the higher, the greater the difference between the resistance values of respectively adjacent n-diffusion resistors 3a, 3b is.

For this reason—in the arrangement of the n-diffusion resistors 3a, 3b according to prior art as illustrated in FIG. 1—, the distance a between respectively adjacent n-diffusion resistors 3a, 3b must be chosen relatively large (in particular in the case of a relatively great difference between the resistance values of the n-diffusion resistors 3a, 3b).

This—relatively large—distance a between the n-diffusion resistors 3a, 3b leads to a relatively large chip space needed altogether for the arrangement of the n-diffusion resistors 3a, 3b.

Figure 2:
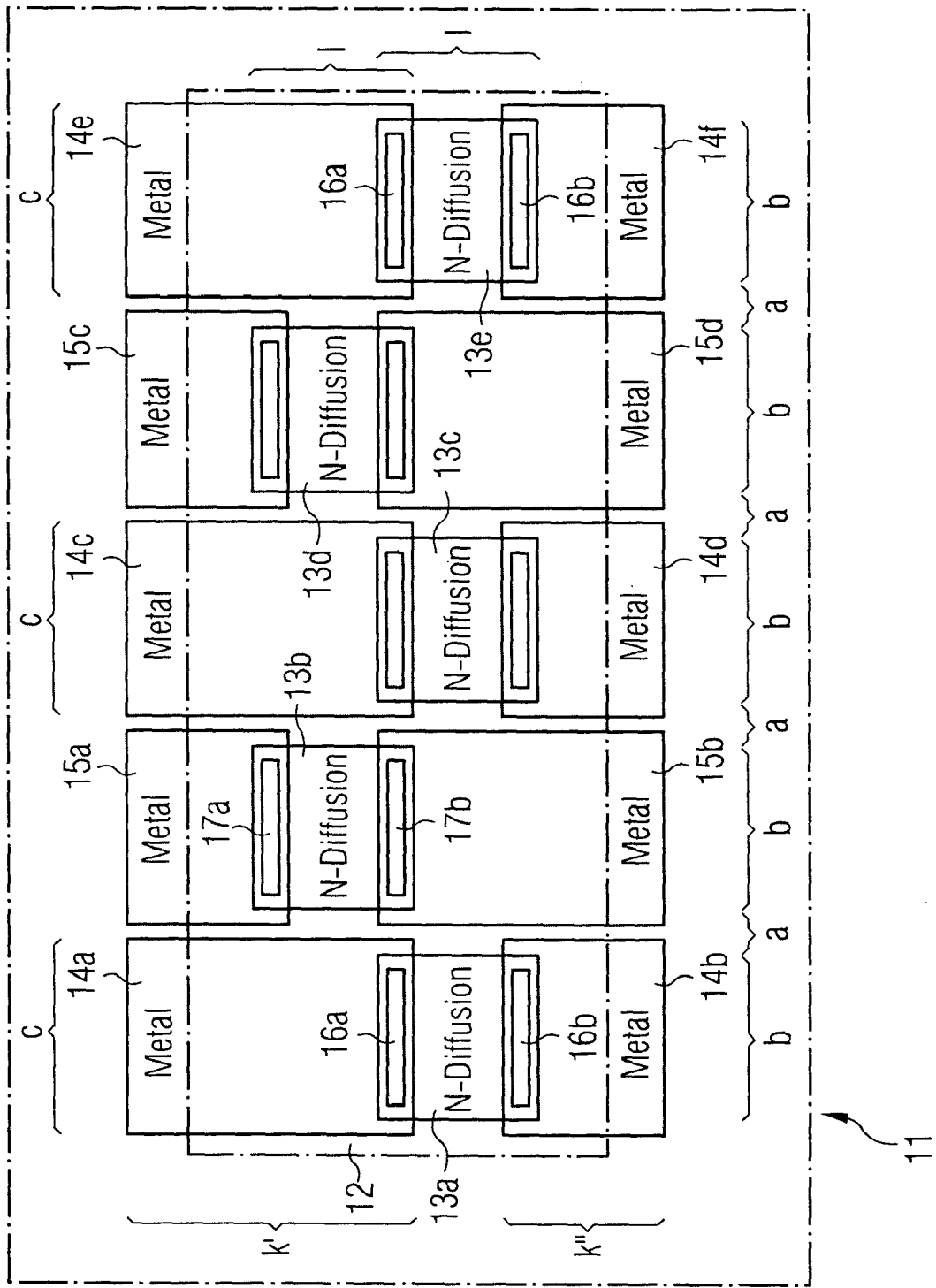
FIG. 2 a sectional view of a portion of a semiconductor device with an arrangement of adjacent n-diffusion resistors positioned in a wn-well, and of metal pads contacting same, in accordance with an embodiment of the present invention.

FIG. 2 shows a sectional view of a portion 11 of a semiconductor device with an arrangement of adjacent n-diffusion resistors 13a, 13b, 13c, 13d, 13e positioned in a wn-well 12, and of metal pads 14a, 14b, 14c, 14d, 14e, 14f, 15a, 15b, 15c, 15d contacting same, in accordance with an embodiment of the invention.

The semiconductor device may e.g. be an integrated (analog or digital) computing circuit, or a semiconductor memory device such as functional memory device (PLA, PAL, etc.), or a table memory device (e.g. ROM or RAM), in particular a DRAM, e.g. a DDR DRAM (Double Data Rate DRAM).

As is illustrated in FIG. 2, the metal pads 14a, 14c, 14e, 15a, 15c—positioned further "at the front" on the semiconductor device vis-à-vis the n-diffusion resistors 13a, 13b, 13c, 13d, 13e—contact the respective n-diffusion resistor 13a, 13b, 13c, 13d, 13e —via a corresponding diffusion metal contact 16a, 17a—at a region positioned at the front end of the n-diffusion resistor 13a, 13b, 13c, 13d, 13e.

In analogy, the metal pads 14b, 14d, 14f, 15b, 15d— positioned further "at the rear" on the semiconductor device vis-à-vis the n-diffusion resistors 13a, 13b, 13c, 13d, 13e— contact the respective n-diffusion resistor 13a, 13b, 13c, 13d, 13e—via a corresponding diffusion metal contact 16b, 17b—at a region positioned at the rear end of the n-diffusion resistor 13a, 13b, 13c, 13d, 13e.

As will be explained in detail further below, the n-diffusion resistors 13a, 13b, 13c, 13d, 13e are—via the metal pads 14a, 14c, 14e, 15a, 15c and the metal pads 14b, 14d, 14f, 15b, 15d—connected between (not illustrated) output pads of the semiconductor device and corresponding (not illustrated, either) signal driver devices of the semiconductor device.

For generating the n-diffusion resistors 13a, 13b, 13c, 13d, 13e, the corresponding region on the semiconductor device or the chip, respectively, is—in a way known as such—relatively strongly n-doped.

As is further illustrated in FIG. 2, the—relatively strongly n-doped—diffusion regions of the n-diffusion resistors 13a, 13b, 13c, 13d, 13e are embedded in a—relatively weakly n-doped—region (namely the wn-well 12 already mentioned above).

In order to save chip space, several (e.g. more than two, three, or four, in particular all) n-diffusion resistors 13a, 13b, 13c, 13d, 13e of the semiconductor device are positioned in one single wn-well 12 (i.e. in addition to the n-diffusion resistors 13a, 13b, 13c, 13d, 13e illustrated in FIG. 2, a plurality of further, not illustrated n-diffusion resistors).

The above-mentioned n-diffusion resistors 13a, 13b, 13c, 13d, 13e positioned in one and the same wn-well 12 all have a substantially identical structure. In particular, the n-diffusion resistors 13a, 13b, 13c, 13d, 13e all have substantially the same length 1, and the same width or breadth b, and the same depth t.

For this reason, a—substantially—identical individual resistance value R results for all of the above-mentioned n-diffusion resistors 13a, 13b, 13c, 13d, 13e.

As is further shown in FIG. 2, the n-diffusion resistors 13a, 13b, 13c, 13d, 13e—being positioned side by side— are, viewed in longitudinal direction of the n-diffusion resistors 13a, 13b, 13c, 13d, 13e, alternately displaced "to the front" or "to the rear" (namely such that every second n-diffusion resistor (e.g. the first, third, and fifth n-diffusion resistors 13a, 13c, 13e) is displaced to the "rear" e.g. by a respectively identical, for instance by substantially half a resistor length ½, and the remaining n-diffusion resistors positioned therebetween (here e.g. the second and fourth n-diffusion resistors 13b, 13d) are displaced by a corresponding length (e.g. half a resistor length ½) to the "front".

The central axes (in particular the central transverse axes) of every second of the adjacent n-diffusion resistors 13a, 13b, 13c, 13d, 13e (i.e. the central axes of the first, third, and fifth n-diffusion resistors 13a, 13c, 13e, and the central axes of the second and fourth n-diffusion resistors 13b, 13d) each lie in one and the same plane (extending transversely from the top to the bottom through the semiconductor device).

Furthermore—also with every second n-diffusion resistor 13a, 13b, 13c, 13d, 13e (i.e. with the first, third, and fifth n-diffusion resistors 13a, 13c, 13e, and with the second and fourth n-diffusion resistors 13b, 13d)—the respective front ends of the corresponding n-diffusion resistors 13a, 13c, 13e or 13b, 13d, respectively (and thus the corresponding— front—diffusion metal contacts 16a or 17a, respectively, of the corresponding n-diffusion resistors 13a, 13c, 13e or 13b, 13d, respectively) lie in one and the same plane (extending in parallel to the above-mentioned central planes).

An analogy—also with every second n-diffusion resistor 13a, 13b, 13c, 13d, 13e (i.e. with the first, third, and fifth n-diffusion resistors 13a, 13c, 13e, and with the second and fourth n-diffusion resistors 13b, 13d)— the respective rear ends of the n-diffusion resistors 13a, 13c, 13e or 13b, 13d, respectively (and thus the corresponding—rear—diffusion metal contacts 16b or 17b, respectively, of the corresponding n-diffusion resistors 13a, 13c, 13e or 13b, 13d, respectively) lie in one and the same plane.

As is further illustrated in FIG. 2, the n-diffusion resistors 13a, 13b, 13c, 13d, 13e are—alternately—displaced to the "front" or to the "rear", respectively, to such an extent that the respective front ends of the first, third and fifth n-diffusion resistors 13a, 13c, 13e displaced to the "rear" (and thus their front diffusion metal contacts 16a) each lie substantially in the same plane as the respective rear ends of the second and fourth n-diffusion resistors 13b, 13d displaced to the "front" (and thus their rear diffusion metal contacts 17b).

Every second of the respectively adjacent metal pads 14a, 14b, 14c, 14d, 14e, 14f, 15a, 15b, 15c, 15d has an identical length k' or k", respectively (in particular has every second of the respective front metal pads 14a, 14c, 14e, and every second of the respective rear metal pads 15b, 15d a—relatively great, first—length k', and the metal pads 14b, 14d, 14f, 15a, 15c therebetween have a—relatively small, second—length k", so that—despite the above-mentioned displaced arrangement of the n-diffusion resistors 13a, 13b, 13c, 13d, 13e—the respective front ends of all respective front metal pads 14a, 14c, 14e, 15a, 15c, and the respective rear ends of all respective rear metal pads 14b, 14d, 14f, 15b, 15d each are substantially positioned in one and the same plane).

As already explained above, each of the n-diffusion resistors 13a, 13b, 13c, 13d, 13e has a—substantially— identical individual resistance value R.

Depending on the respectively desired resistance value $R_{desired}$ of an intermediate resistor—which is to be formed by the n-diffusion resistors 13a, 13b, 13c, 13d, 13e and is to be connected between a particular signal driver device and the pertinent output pad—, a particular number of n-diffusion resistors 13a, 13b, 13c, 13d, 13e is connected in parallel and is connected with the corresponding output pad and the pertinent signal driver device (so that—for e.g. two n-diffusion resistors 13a, 13b connected in parallel—e.g. a total resistance value $R_{total}$ of R/2 results for the resulting intermediate resistor, for three n-diffusion resistors 13a, 13b, 13c connected in parallel, e.g. a total resistance value $R_{total}$ of R/3, etc.).

For connecting the corresponding n-diffusion resistors 13a, 13b, 13c, 13d, 13e in parallel between a particular output pad and a pertinent driver device, the corresponding front metal pads 14a, 14c, 14e, 15a, 15c of the respective n-diffusion resistors 13a, 13b, 13c, 13d, 13e to be connected in parallel are—jointly—connected to the corresponding output pad, and the corresponding rear metal pads 14b, 14d, 14f, 15b, 15d of the respective n-diffusion resistors 13a, 13b, 13c, 13d, 13e to be connected in parallel are—jointly— connected to the corresponding signal driver device.

By the fact that the resistance value $R_{total}$ of the respective intermediate resistor that is connected between the corresponding signal driver device and the corresponding output pad—and that is formed by the corresponding number of n-diffusion resistors 13a, 13b, 13c, 13d, 13e connected in parallel—is chosen appropriately (in particular such that the following applies: $R_{total} \cong R_{desired}$), a linearization of the driver behavior may be achieved with the semiconductor device.

Since all n-diffusion resistors 13a, 13b, 13c, 13d, 13e have the same individual resistance value R, and due to the relatively large distance c between two respectively adjacent n-diffusion resistors lying in the same plane, which results from the displaced arrangement of the n-diffusion resistors 13a, 13b, 13c, 13d, 13e (e.g. the distance c between the second n-diffusion resistor 13b and the fourth n-diffusion resistor 13d), the influence of the parasitic resistor—formed by the wn-well 12 and connecting the individual n-diffusion resistors 13a, 13b, 13c, 13d, 13e with one another—on the effectively resulting individual resistance R' of the n-diffusion resistors 13a, 13b, 13c, 13d, 13e—taking into account the parasitic resistor—(or on the total resistance value $R_{total}'$ effectively resulting by the above-mentioned parallel connection—taking into account the parasitic resistor—) is relatively minor.

For this reason, in the arrangement of the n-diffusion resistors 13a, 13b, 13c, 13d, 13e illustrated in FIG. 2, the distance a between directly succeeding n-diffusion resistors lying in displaced planes (e.g. the distance a between the first n-diffusion resistor 13 and the second n-diffusion resistor 13b, the distance a between the second n-diffusion resistor 13b and the third n-diffusion resistor 13c, etc.) may be chosen relatively small.

This—relatively small—distance a between the n-diffusion resistors 13a, 13b, 13c, 13d, 13e leads to a relatively small chip space needed altogether for the arrangement of the n-diffusion resistors 13a, 13b, 13c, 13d, 13e.

Since the structure of each n-diffusion resistor 13a, 13b, 13c, 13d, 13e is identical to the structure of the remaining n-diffusion resistors 13a, 13b, 13c, 13d, 13e (and since each n-diffusion resistor is arranged appropriately vis-à-vis the remaining ones), a standard environment is provided which—once—modelled and verified, enables an exact predictability of the respective—effectively—resulting resistance values.

The invention claimed is:

1. An arrangement of several resistors comprising: the resistors jointly positioned in one and the same well of a semiconductor device, wherein each of the resistors are extending in a longitudinal direction and are spaced laterally from each other and wherein each of the resistors is alternately displaced toward opposite sides of the well in the longitudinal direction of the resistors in relation to an adjacent resistor, the arrangement configured to reduce coupling between said resistors.

2. The arrangement according to claim 1, wherein the resistors all have substantially the same length.

3. The arrangement according to claim 1, wherein the resistors all have substantially the same breadth or width, respectively.

4. The arrangement according to claim 1, wherein the resistors all have substantially the same depth.

5. The arrangement according to claim 1, wherein the resistors all are of substantially identical structure.

6. The arrangement according to claim 1, wherein the resistors all have substantially the same individual resistance value.

7. The arrangement according to claim 1, wherein each of the resistors is displaced in the longitudinal direction of the resistors such that substantially none of a first resistor overlaps with an adjacent resistor.

8. The arrangement according to claim 1, said arrangement comprising at least five resistors.

9. The arrangement according to claim 1, wherein a distance between a first resistor of said resistors and a second resistor of said resistors, when viewed in a transverse direction of the resistors, is smaller than one fifth of a length of said first resistor or of said second resistor, respectively.

10. The arrangement according to claim 1, wherein a first resistor of said resistors is displaced approximately a length of a second resistor of said resistors, wherein said first resistor is adjacent to said second resistor.

11. The arrangement according to claim 1, wherein a distance between a first resistor of said resistors and a second resistor of said resistors, when viewed in a transverse direction of the resistors, is smaller than one third of a breadth or width, of said first resistor or of said second resistor, respectively.

12. The arrangement according to claim 1, wherein a distance between a first resistor of said resistors and a second resistor of said resistors, when viewed in a transverse direction of the resistors, is smaller than one fifth of a breadth or width of said first resistor or of said second resistor, respectively.

13. The arrangement according to claim 1, wherein the well is relatively weakly n-doped.

14. The arrangement according to claim 1, wherein the resistors are relatively strongly n-doped.

15. The arrangement according to claim 14, wherein the resistors are n-diffusion resistors.

16. The arrangement according to claim 1, wherein the resistors are connected to corresponding signal driver devices of the semiconductor device.

17. The arrangement according to claim 1, wherein the resistors are connected to corresponding output pads of the semiconductor device.

18. The arrangement according to claim 1, wherein the resistors are connected in parallel.

19. The arrangement according to claim 18, wherein the resistors are connected in parallel such that a total resistance value results for the resistors connected in parallel which corresponds to a desired resistance value.

20. The arrangement according to claim 19, wherein the resistors connected in parallel are jointly connected to a particular signal driver device, and wherein the desired resistance value corresponds to a resistance value desired for the corresponding signal driver device.

21. A semiconductor device comprising: an arrangement of resistors, the arrangement includes the resistors jointly positioned in one and the same well of a semiconductor device, wherein each of the resistors are extending in a longitudinal direction, and are spaced laterally from each other and wherein each of the resistors is alternately displaced toward opposite sides of the well in the longitudinal direction of the resistors in relation to an adjacent resistor, the arrangement configured to reduce coupling between said resistors.

22. The arrangement according to claim 1, wherein a distance between a first resistor of said resistors and a second resistor of said resistors, when viewed in a transverse direction of the resistors, is smaller than one third of a length of said first resistor or of said second resistor, respectively.

* * * * *